US009002082B2

(12) United States Patent
Ambwani et al.

(10) Patent No.: US 9,002,082 B2
(45) Date of Patent: Apr. 7, 2015

(54) AXIALLY VARYING TRUNCATION COMPLETION FOR MR-BASED ATTENUATION CORRECTION FOR PET/MR

(71) Applicant: General Electric Company, Schenectady, NY (US)

(72) Inventors: Sonal Ambwani, Westborough, MA (US); Scott Wollenweber, Waukesha, WI (US)

(73) Assignee: General Electric Company, Schenectady (*) Notice: Subject to any disclaimer, the term of this patent is extended or adjusted under 35 U.S.C. 154(b) by 280 days.

(21) Appl. No.: 13/728,066

(22) Filed: Dec. 27, 2012

(65) Prior Publication Data
US 2014/0185893 A1 Jul. 3, 2014

(51) Int. Cl.
G06K 9/00 (2006.01)
G01R 33/48 (2006.01)

(52) U.S. Cl.
CPC .................. G01R 33/481 (2013.01)

(58) Field of Classification Search
None
See application file for complete search history.

(56) References Cited

U.S. PATENT DOCUMENTS

| 7,515,676 | B2* | 4/2009 | Zamyatin .................. 378/4 |
| 7,684,589 | B2 | 3/2010 | Nilsen et al. |
| 7,923,691 | B2 | 4/2011 | Ladebeck |
| 8,218,848 | B2 | 7/2012 | Lenglet et al. |
| 8,620,053 | B2* | 12/2013 | Michel et al. ............... 382/131 |
| 2007/0253523 | A1* | 11/2007 | Zamyatin .................. 378/4 |
| 2008/0135769 | A1 | 6/2008 | Rosen |
| 2009/0129651 | A1* | 5/2009 | Zagzebski et al. .......... 382/131 |
| 2010/0066385 | A1 | 3/2010 | Jattke et al. |
| 2010/0268063 | A1 | 10/2010 | Schmidt |
| 2010/0331665 | A1 | 12/2010 | Ladebeck |

(Continued)

FOREIGN PATENT DOCUMENTS

WO  WO2007018646  2/2007
WO  WO2008064319  5/2008

OTHER PUBLICATIONS

Qian, Rua, et al. "Truncation completion of MR-based PET attenuation maps using time-of-flight non-attenuation-corrected PET images." Nuclear Science Symposium and Medical Imaging Conference (NSS/MIC), 2012 IEEE. IEEE, 2012, Oct. 27, 2012-Nov. 3, 2012.*

(Continued)

Primary Examiner — Tahmina Ansari
(74) Attorney, Agent, or Firm — Lucas Divine; General Electric Company (57) ABSTRACT

An apparatus and method for a PET/MR system having a PET scanner and an MR scanner. A patient may be advanced through the system in sequential stations, with multiple transverse slices defined within at least one of the stations in which each slice is offset a distance $\Delta z$ from the station centerline. The method may comprise the steps of: defining a center and an annulus thereabout for each slice, wherein the annulus has an inner radius $R_{eff}$ and an outer radius $R_{out}$; conducting attenuation correction of the PET images using only MR data from the region within the inner radius, only PET data from the region outside the outer radius, and a combination of PET and MR data from the region of the annulus; and varying $R_{eff}$ as a function of $\Delta z$ for selected slices within the station.

20 Claims, 9 Drawing Sheets

(56) References Cited

U.S. PATENT DOCUMENTS

| | | |
|---|---|---|
| 2011/0007959 A1 | 1/2011 | Schulz et al. |
| 2011/0110570 A1 | 5/2011 | Bar-Shalev |
| 2011/0123083 A1 | 5/2011 | Ojha et al. |
| 2011/0164801 A1 | 7/2011 | Gagnon et al. |
| 2011/0187364 A1 | 8/2011 | Blumhagen et al. |
| 2011/0309251 A1 | 12/2011 | Tenchel |
| 2011/0317900 A1 | 12/2011 | Pal et al. |
| 2012/0056621 A1 | 3/2012 | Blumhagen et al. |
| 2012/0063659 A1* | 3/2012 | Wang et al. ............... 382/131 |
| 2013/0057282 A1* | 3/2013 | Blumhagen et al. ......... 324/309 |
| 2013/0142411 A1* | 6/2013 | Da Silva et al. ............. 382/131 |
| 2014/0185893 A1* | 7/2014 | Ambwani et al. ............ 382/131 |

OTHER PUBLICATIONS

A. Martinez-Möller et al., "Tissue classification as a potential approach for attenuation correction in whole-body PET/MRI: evaluation with PET/CT data.," Journal of nuclear medicine•:official publication, Society of Nuclear Medicine, vol. 50, No. 4, pp. 520-526, Apr. 2009.

T. F. Chan and L. A. Vese, "Active contours without edges.," IEEE transactions on image processing•:a publication of the IEEE Signal Processing Society, vol. 10, No. 2, pp. 266-277, Jan. 2001.

M. J. van der Bom et al., "Registration of 2D x-ray images to 3D MRI by generating pseudo-CT data", Phys. Med. Biol. 56 (2011) 1031-1043.

* cited by examiner

AXIALLY VARYING TRUNCATION COMPLETION FOR MR-BASED ATTENUATION CORRECTION FOR PET/MR

BACKGROUND OF THE INVENTION

The present invention relates generally to medical imaging, and more particularly to PET/MR-based medical imaging.

PET/MR is a hybrid medical imaging modality in which a positron emission tomography (PET) scanner and a magnetic resonance (MR) scanner are integrated together into a single imaging system. In this combination, MR is typically used for anatomical imaging (which shows the physical structure of the anatomy being imaged) while PET is used for functional imaging (which shows the function or metabolism of the anatomy being imaged). The MR and PET images may be registered with each other with the functional PET images superimposed on the anatomical MR images, thereby showing the functional or metabolic activity in the imaged anatomy.

In PET imaging, the patient is typically injected with a radiopharmaceutical such as $F^{18}$-fluorodeoxyglucose (FDG) which is essentially a radioactive form of glucose that emits positrons (i.e., positively charged particles of anti-matter). As the FDG is circulated throughout the patient's body, the glucose is metabolized by the tissues and organs. Meanwhile, the positrons being emitted from the FDG collide with nearby electrons in the surrounding tissue causing annihilation events, each of which causes a pair of 511 keV gamma photons to be emitted approximately 180 degrees from each other. The PET detectors (which are typically arrayed in a ring about the patient) gather these emitted photons, but first the photons must pass from the various points of annihilation through the patient's body. When two detectors detect a pair of photons within a given time window, and the line between the two detectors passes through the patient, it is assumed that the pair of photons originated at a point (an annihilation event location) somewhere near the midpoint of the line. (With the faster temporal resolution of time-of-flight (TOF) PET scanners, the difference in photon arrival times detected by the two detectors can be used to more precisely estimate the annihilation event location, than can non-TOF scanners.)

PET images are created by accumulating the line integrals of coincidence events between pairs of detectors, and reconstructing these line integrals among all the various detector pairs into images. However, the 511 keV gamma photons summed into these line integrals do not all pass through the same type or quantity of patient tissue. For example, if an annihilation event occurs near the skin surface on the right side of a patient's torso, one of the two resulting gamma photons may travel through a very small amount of skin tissue on the patient's right side before hitting and being detected by a detector on the PET detector ring, while the other gamma photon may travel through most of the patient's body (including through bone) before exiting the patient's left side and being detected by a detector on the opposite side of the detector ring. Thus, to optimally use these two detected gamma photons in the image reconstruction process, it is useful to know the particular anatomy through which each photon traveled on its path to the detectors since there is a probability that one or both photons will interact in the body and be lost, so that appropriate corrections can be made for this event loss probability. The process of determining the anatomy and using it to make these corrections is known as attenuation correction (AC). This correction is necessary (among other corrections) to accurately determine the radiotracer activity concentration that bio-distributes within the patient's body. A commonly used method for accomplishing AC in PET imaging is to utilize an X-ray-based computed tomography (CT) scan from a CT scanner. A CT scan can be used to create a "map" of the patient's anatomy (consisting of transverse multiple imaging slices taken through the patient), with various identifiable structures and/or tissue densities being assigned appropriate Hounsfield unit (HU) numbers representing the degree to which various tissues attenuate X-ray radiation (which is comprised of photons having energies of approximately 90-140 keV). This CT-based "attenuation map" can then be converted into a corresponding PET-based attenuation map which represents the degree to which various tissues attenuate 511 keV gamma photons. This attenuation map is then used to make appropriate corrections to the detected gamma photon data so that an attenuation-corrected PET image can be formed.

Figure 1:
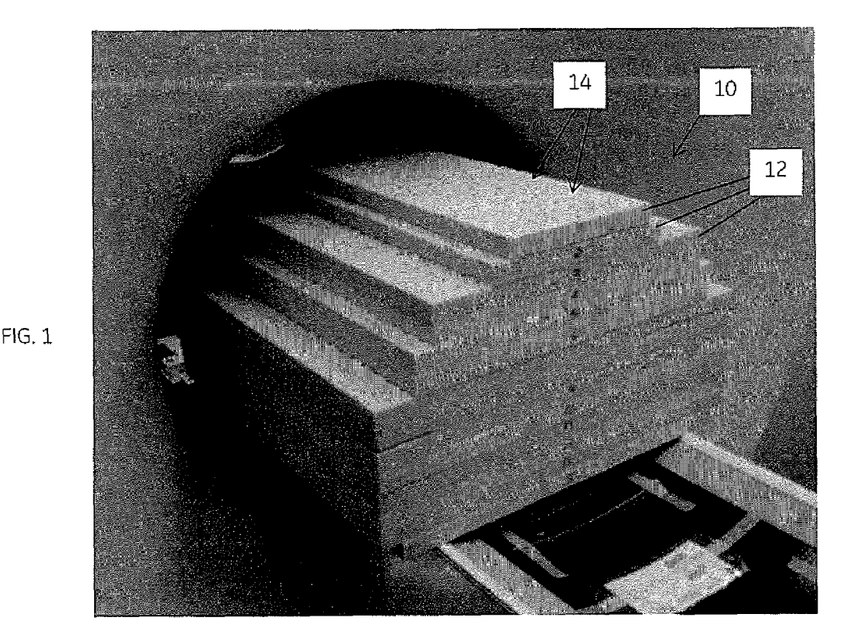
FIG. 1 is an isometric view of a spatial distortion phantom.
Figure 2:
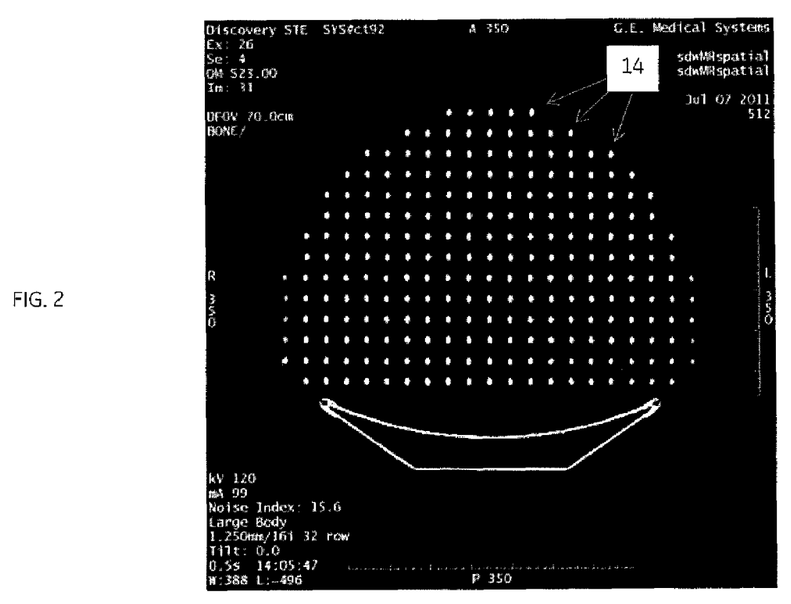
FIG. 2 shows a transverse scan of the spatial distortion phantom using CT.
Figure 3:
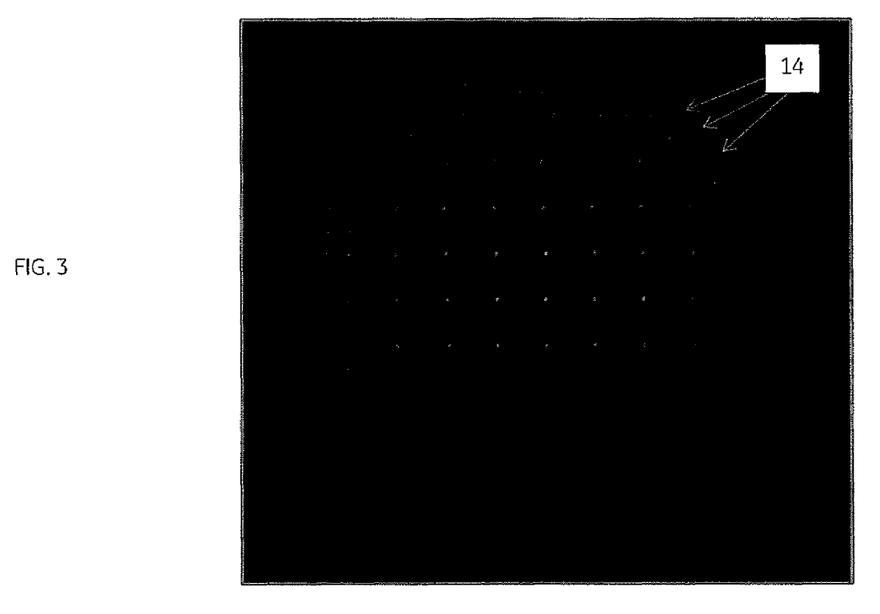
FIG. 3 shows a transverse scan of the spatial distortion phantom using MR.
Figure 4:
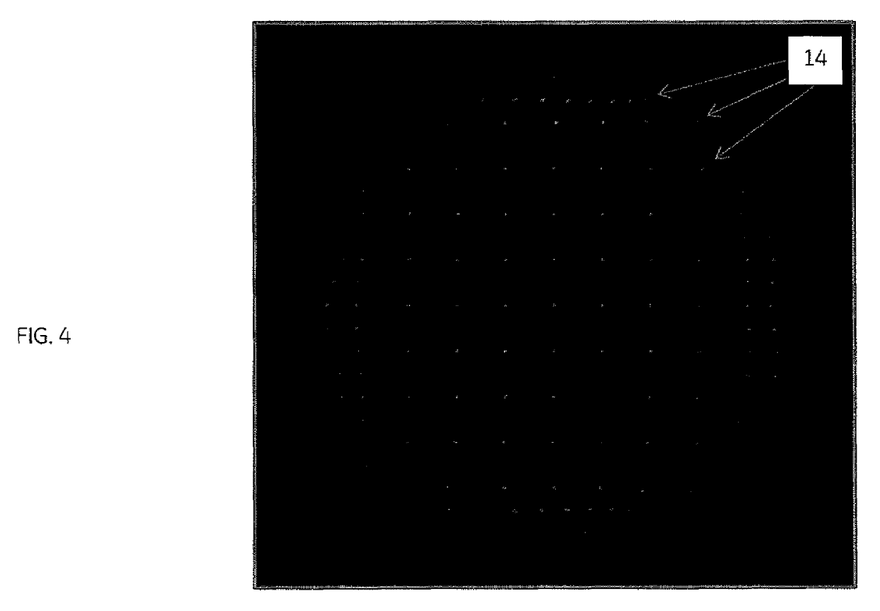
FIG. 4 shows a coronal scan of the spatial distortion phantom using MR.

MR imaging is relatively accurate in the center of the MR field-of-view (FOV), but the images become distorted close to the FOV edges, both in the transverse and axial directions. This is illustrated in FIGS. 1-4, which compares phantom scans in CT and MR. FIG. 1 shows a spatial distortion phantom 10, which is constructed of multiple stacked planks 12 having holes milled into them at regular intervals. The holes are filled with fish oil capsules 14, which make good water-like signals for CT as well as provide good T1 signals for MR. The phantom 10 is imaged in a CT scanner, with a resulting transverse (x-y) image shown in FIG. 2. Note the minimal distortion across the CT FOV, as evidenced by the accurate representation of the oil capsule regular spacing throughout the FOV. The same phantom is then imaged in an MR scanner, with the resulting transverse (x-y plane) and coronal (x-z plane) scans shown in FIGS. 3 and 4, respectively. Both of the MR scans show accurate representations of the fish oil capsules 14 nearer to the centers of the FOVs, but the images of oil capsule placement become quite distorted toward the outer edges. Because of this distortion, MR has a limited effective FOV (at least as compared to CT, and for that matter as compared to PET as well), and the resulting images are typically "truncated", either intentionally, so as to retain only the more accurate medial data and cut off or exclude the more distorted distal data, or incidentally/naturally as part of the MR image formation process.

Figure 5:
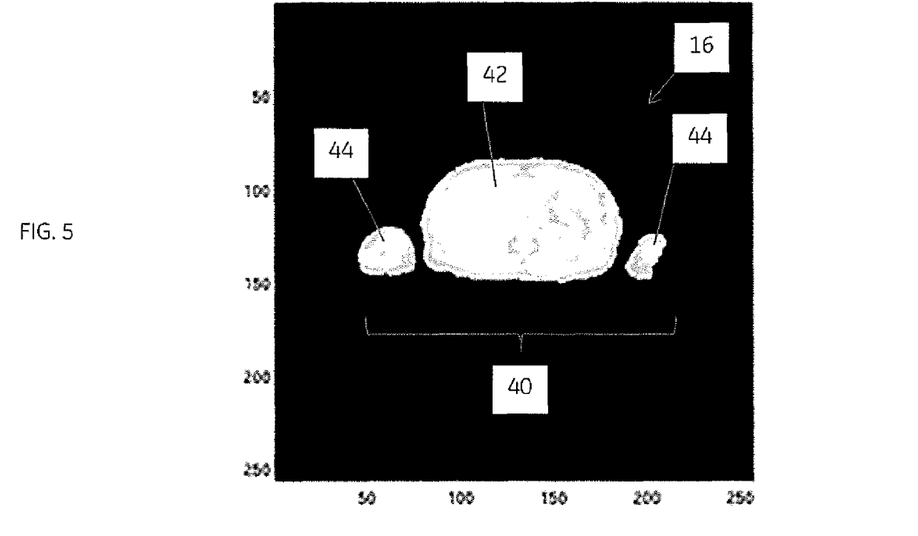
FIG. 5 is an initial MR/pseudo-CT mask.
Figure 6:
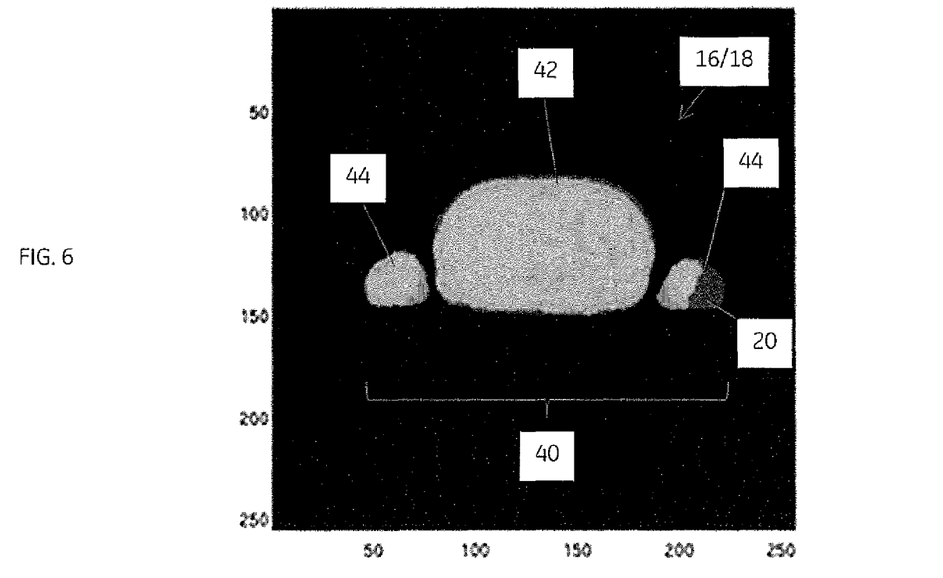
FIG. 6 shows the co-registration of the initial MR/pseudo-CT mask and the PET TOF-NAC binary mask.
Figure 7:
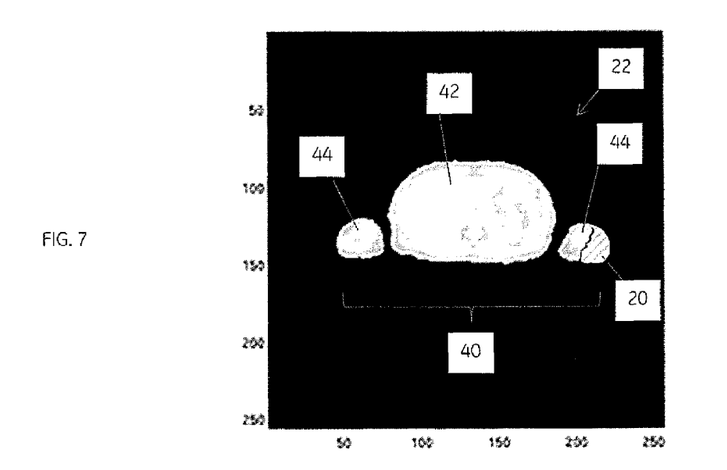
FIG. 7 shows a corrected MR/pseudo-CT mask.

This truncation creates a challenge for PET/MR systems which may utilize MR for AC rather than the more commonly used CT-based AC. Typical MR-based AC (MRAC) may utilize the following process. First, an MR scan is conducted to create MR images/data, such as by using the well-known T1-weighted, 2-point Dixon (LAVA-FLEX) pulse sequence. Second, the MR images are segmented into regions representative of different patient tissue types, such as fat, water, internal air (inside the patient, e.g., lungs) and background (air outside the patient). Third, appropriate (CT) HU values are assigned to each region, which creates a "pseudo-CT" mask 16, as illustrated in FIG. 5, which shows a transverse slice of a patient 40 through the torso 42 and arms 44. Note in FIG. 5 how at least one of the arms 44 has been truncated due to the limited MR DFOV (diameter of the in-plane x-y FOV), making the image of the truncated arm incomplete. Fourth, a non-attenuation corrected (NAC) PET image is reconstructed using time-of-flight (TOF) at the PET diameter FOV (DFOV), which is larger than the MR DFOV. Fifth, the PET TOF-NAC image is used to determine the patient's body surface contour or outline (e.g., using the Chan-Vese active contour estimation algorithm). Sixth, the body surface contour/outline is used to produce a binary body mask 18. Seventh, the MR/pseudo-CT mask and the binary body mask are co-registered with each other as shown in FIG. 6, and any regions 20 that are truncated (i.e., appearing in the PET-derived binary body mask, but not appearing in the MR/pseudo-CT mask) are identified. Eighth, the MR/pseudo-CT mask is corrected by "filling in" the truncated regions 20 (i.e., "truncation completion"). Finally, the corrected MR/pseudo-CT mask 22 as shown in FIG. 7 (in which the filled-in formerly truncated arm region 20 is shown in cross-hatching) is used for MR-based attenuation completion of the PET images. However, because of the distortion that occurs in MR images toward the edges of the MR FOV, the foregoing process for MR-based AC may unintentionally include distorted data.

It would be desirable, therefore, to provide an improved system and method for truncation completion and MR-based attenuation correction for PET and PET/MR which mitigates the abovementioned shortcomings, and which provides advantages that are not found in the prior art approaches.

SUMMARY OF THE INVENTION

Figure 8:
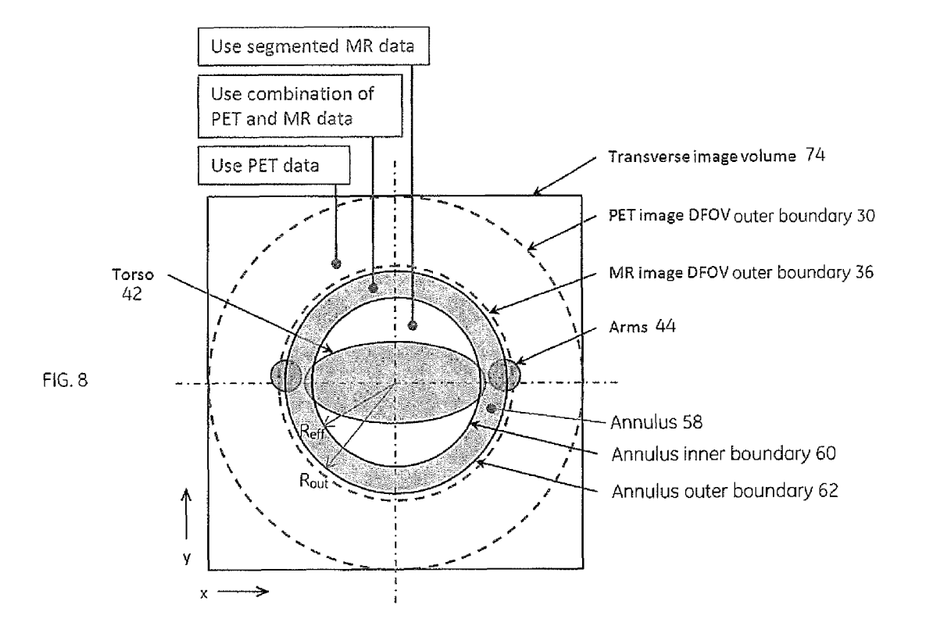
FIG. 8 is a diagram of a transverse PET/MR scan according to an embodiment of the present invention.
Figure 9:
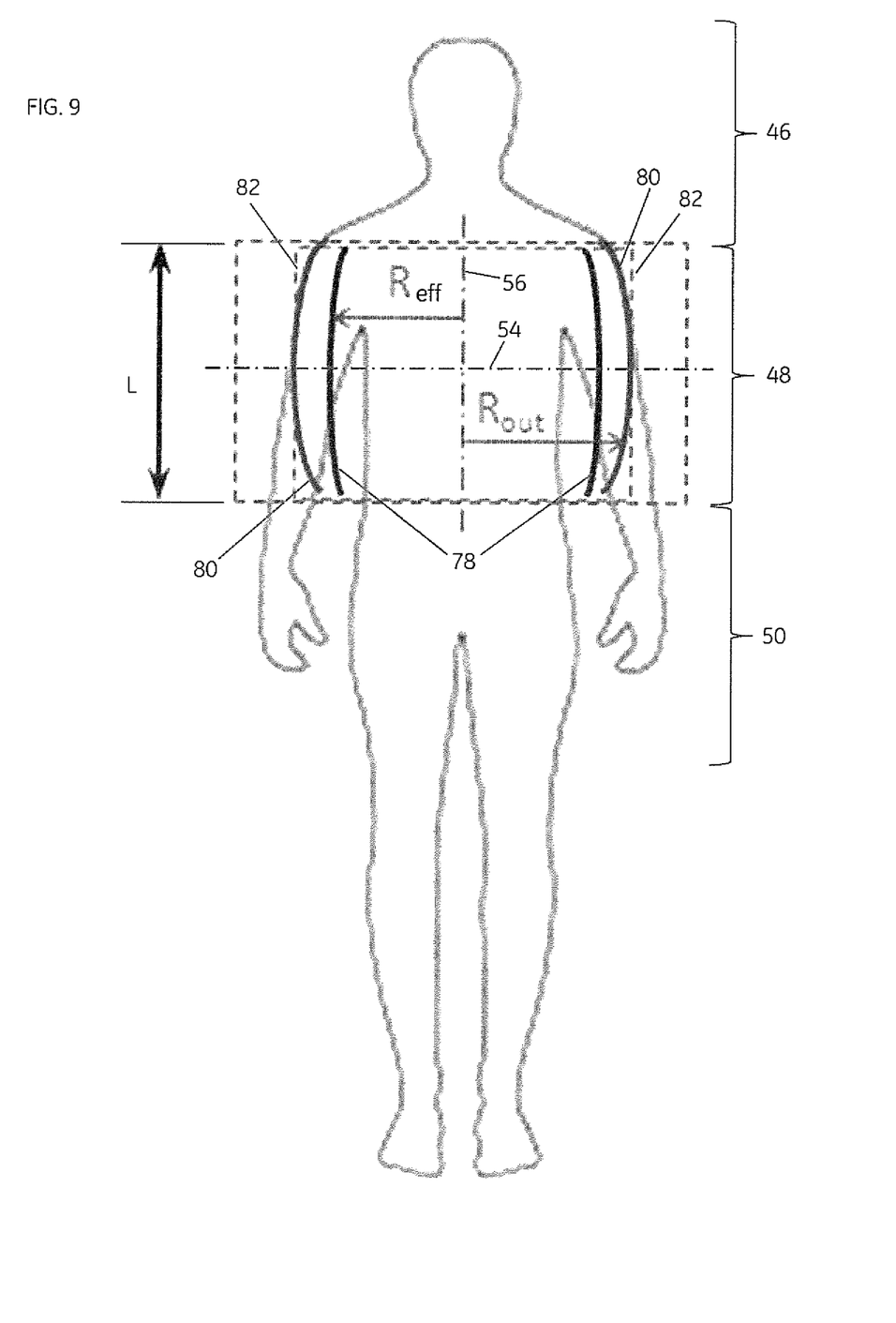
FIG. 9 is a coronal view of a PET/MR scan according to an embodiment of the present invention.
Figure 10:
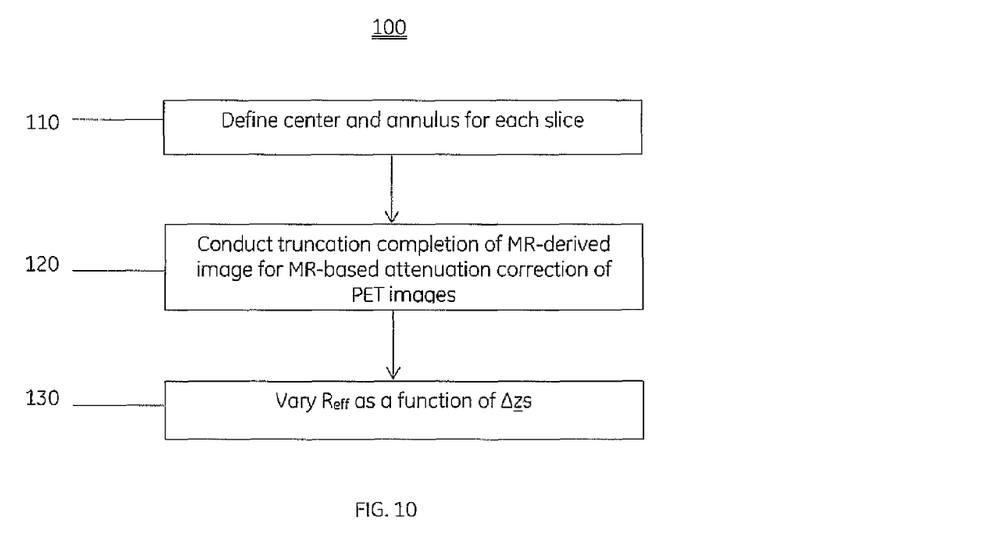
FIG. 10 is a flowchart of a method according to an embodiment of the present invention.

In one or more embodiments of the present invention, there is provided a method for truncation completion of an MR-derived image for attenuation correction in a PET/MR system having a PET scanner with a first diameter field of view $DFOV_{PET}$ and an MR scanner with a second diameter field of view $DFOV_{MR}$, in which a patient may be advanced through the system in sequential stations, with multiple transverse slices defined within at least one of the stations in which each slice is offset an axial distance $\Delta z$ from the station centerline (54, see FIGS. 8-9). The method comprises the steps of: (a) defining a center and an annulus thereabout for each slice, wherein the annulus has an inner radius $R_{eff}$ and an outer radius $R_{out}$ extending from the center; (b) conducting attenuation correction of image data from the PET scanner using MR data from the region within the inner radius, PET data from the region outside of the outer radius, and both PET and MR data from the region of the annulus; and (c) varying $R_{eff}$ as a function of $\Delta z$ for selected slices within the at least one station. The center of each slice may coincide with the centroid thereof or with the intersection of the scanner axis and the station centerline. $R_{out}$ may be approximately equal to $DFOV_{MR}/2$, or it may be less than this. $R_{eff}$ may be decreased as $\Delta z$ increases. The at least one station may have an axial field of view length L (along the scanner axis z) and $R_{eff}$ may be equal to $\sqrt{(R_{in}^2 - \beta^2 \Delta z^2)}$, wherein $R_{in}$ is selected as a radius within which distortion of the MR data at the station isocenter is acceptably low and $\beta$ is an adaptive weighting factor which is a function of both L and $\Delta z$, such as $\beta = 2\Delta z/L$. $R_{out}$ may be decreased as $\Delta z$ increases for selected slices within the station. The PET data may be non-attenuation corrected time-of-flight data obtained from the PET scanner, and the MR data may be segmented into regions representing at least two of fat, water, internal air (e.g., lungs) and background/external air. The PET and MR data from the region of the annulus may comprise (i) the union of voxels determined as tissue by either PET data, MR data or both, and/or (ii) a weighted combination of PET data and MR data based on the location (radius) of each voxel between $R_{eff}$ and $R_{out}$.

In another embodiment of the present invention, there is provided a medical imaging system through which a subject of interest may be advanced in sequential stations, comprising: a PET imaging system, an MR imaging system operably coupled with the PET imaging system, and a computer coupled to the PET system and the MR system. The computer may be programmed to define multiple transverse slices within at least one of the stations in which each slice is offset an axial distance $\Delta z$ from the station centerline; define a center and an annulus thereabout for each slice, wherein the annulus has an inner radius $R_{eff}$ and an outer radius $R_{out}$ extending from the center; and conduct attenuation correction of image data from the PET system using MR data from the region within the inner radius, PET data from the region outside of the outer radius, and both PET and MR data from the region of the annulus, in which $R_{eff}$ is decreased as $\Delta z$ is increased within the at least one station. The computer may be further programmed to obtain an MR image dataset and a PET emission dataset of the subject of interest, and the PET data may be non-attenuation corrected time-of-flight data while the MR data may be segmented into regions representing at least two of fat, water, internal air/lungs and background/external air.

The various embodiments of the present invention may be utilized for truncation completion of the MR images, data and/or mask, and/or for MRAC of PET images in a PET/MR system.

DETAILED DESCRIPTION OF THE INVENTION

The foregoing summary, as well as the following detailed description of certain embodiments of the present invention, will be better understood when read in conjunction with the appended drawings. To the extent that the figures illustrate diagrams of the functional blocks of various embodiments, the functional blocks are not necessarily indicative of the division between hardware or circuitry. For example, one or more of the functional blocks (e.g., processors or memories) may be implemented in a single piece of hardware (e.g., a general purpose signal processor or random access memory, hard disk, or the like); likewise, a single functional block may be implemented in more than one piece of hardware. Similarly, the programs may be stand-alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, any references to a particular embodiment or example of the present invention are not intended to be interpreted as excluding the existence of additional embodiments or examples that also incorporate the recited features. Moreover, unless explicitly stated to the contrary, embodiments "comprising" or "having" an element or a plurality of elements having a particular property may include additional such elements not having that property.

Also, as used herein, the phrase "reconstructing an image" and any other references to an "image" are not intended to exclude embodiments of the present invention in which data representing an image is generated, but a viewable image is not. Therefore, as used herein, the term "image" broadly refers to viewable images and/or to data representing a viewable image. However, many embodiments may generate, or may be configured to generate, at least one viewable image.

Various embodiments of the invention provide a system and method for performing truncation completion and attenuation correction for PET/MR. A technical effect of the various embodiments is to provide a PET/MR system that is configured to perform truncation completion and attenuation correction utilizing particular aspects and characteristics of PET imaging and MR imaging, which can be beneficially used together.

To assist the reader in understanding the embodiments of the present invention that are disclosed, all reference numbers, acronyms and variable names used herein are summarized below, along with the elements they represent:

10 Spatial distortion phantom
12 Planks
14 Fish-oil capsules
16 Initial MR/pseudo-CT mask
18 PET TOF-NAC binary mask
20 Truncated portion
22 Corrected MR/pseudo-CT mask
24 PET/MR system
26 PET scanner
28 PET DFOV
30 PET DFOV outer boundary
32 MR scanner
34 MR DFOV
36 MR DFOV outer boundary
38 Computer/control system
40 Patient/Subject of interest
42 Torso
44 Arms
46, 48, 50 Stations
52 Transverse slice
54 Axial centerline of station
56 Transverse centerline of station
58 Annulus
60 Annulus inner boundary
62 Annulus outer boundary
64 Region within the inner radius
66 Region outside the outer radius
68 Region of the annulus
70 Scanner axis
72 Station isocenter
74 Transverse image volume 76 Axial image volume
78 Curved trace of $R_{eff}$ along station length
80 Curved trace of $R_{out}$ along station length
82 Straight trace of $R_{out}$ along station length
100 Method of the present invention
110 Step (a): Define center, annulus
120 Step (b): Conduct truncation completion/attenuation correction
130 Step (c): Vary $R_{eff}$ as a function of $\Delta z$
$R_{PET\ DFOV}$ Radius of the PET DFOV
$R_{MR\ DFOV}$ Radius of the MR DFOV
$C_n$ Center of the $n^{th}$ slice
$R_{in}$ Maximum acceptable inner radius of annulus
$R_{out}$ Outer radius of annulus
$R_{eff}$ Effective inner radius of annulus
$\beta$ Adaptive weighting factor
L Length of the PET/MR AFOV
$\Delta z$ Offset from centerline to slice
$\Delta s$ Transverse slice thickness
AC Attenuation correction
AFOV Axial field of view
CT Computed Tomography
DFOV Diameter (transverse) field of view
HU Hounsfield units
MR Magnetic resonance
MRAC MR-based attenuation correction
NAC Non-attenuation corrected
PET Positron emission tomography
TOF Time-of-flight Referring now to the drawings, FIGS. 8-15 show various embodiments of the present invention, in which there is provided a system 24 and method 100 for attenuation correction (and/or for truncation completion of an MR-derived image for use in attenuation correction) in a PET/MR system 24 having a PET scanner 26 with a first diameter field of view $DFOV_{PET}$ 28 having an outer boundary 30 and a radius $R_{PET\ DFOV}$, and an MR scanner 32 with a second diameter field of view $DFOV_{MR}$ 34 having an outer boundary 36 and a radius $R_{MR\ DFOV}$. A patient or other subject of interest 40 (e.g., a phantom, a region of interest within a patient, etc.) may be advanced through the system 24 in sequential stations 46/48/50, with multiple transverse slices 52 defined within at least one of the stations (here, for the sake of illustration only, station 48) in which each slice 52 has a thickness $\Delta s$ and is offset an axial distance $\Delta z$ from the station's axial centerline 54. The method 100 comprises the steps of: (110) defining a center and an annulus 58 thereabout for each slice 52, wherein the annulus has an inner boundary 60 defined by an inner radius $R_{eff}$ extending from the center, and an outer boundary 62 defined by an outer radius $R_{out}$ extending from the center; (120) conducting attenuation correction of image data from the PET scanner using MR data from the region 64 within the inner radius, PET data from the region 66 outside of the outer radius, and both PET and MR data from the region 68 of the annulus; and (130) varying $R_{eff}$ as a function of $\Delta z$ for selected slices 52 within the at least one station 48.

FIG. 8 shows a transverse slice and its corresponding transverse image volume 74 according to an embodiment of the present invention. The center of each slice 52 may coincide with the centroid $C_n$ of the slice, or with the intersection of the scanner axis 70 and the station's axial centerline 54. (Since the PET scanner 26 and MR scanner 32 are typically mechanically co-registered, they both typically share the same scanner axis. Depending on the particular station and how the patient or subject of interest 40 may be disposed within a given transverse slice, the scanner axis 70 may or may not coincide with the station's transverse centerline 56.)

The outer radius $R_{out}$ may be selected to be approximately equal to $DFOV_{MR}/2$, or it may be selected to be less than this. The inner radius $R_{eff}$ may be decreased as $\Delta z$ increases; thus, the inner radius may also be referred to herein as the "effective inner radius", since it may change/decrease in magnitude the further away a particular slice 52 is from the axial centerline 54.

Figure 11:
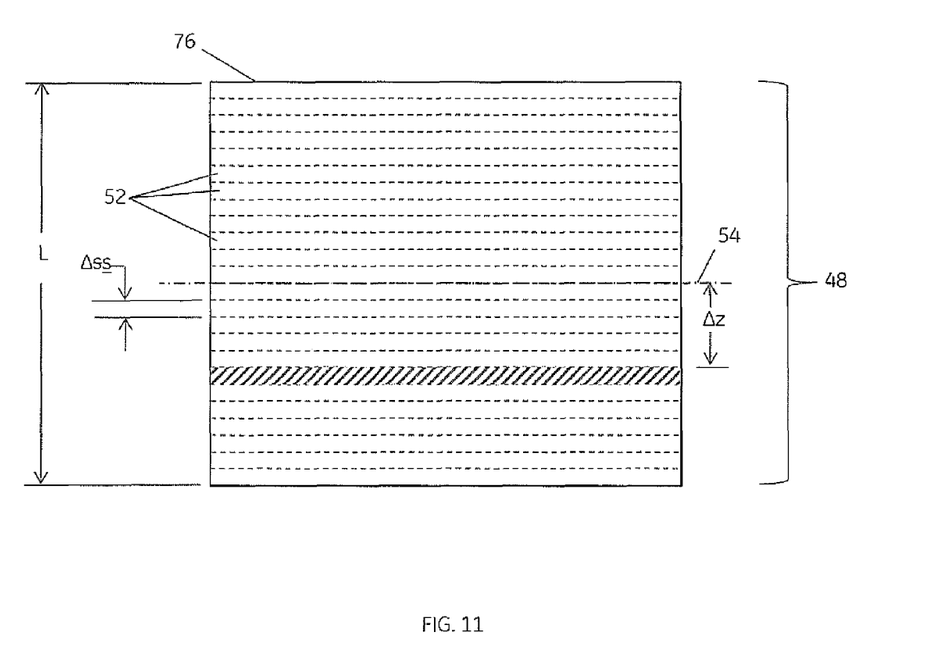
FIG. 11 shows a representative station having multiple transverse slices according to an embodiment of the present invention.

FIG. 11 shows a representative station 48 having multiple transverse slices 52 according to an embodiment of the present invention. (Although shown here as generally contiguous, the slices may also be non-contiguous or overlapping.) An axial centerline 54 divides the station in half, with twelve slices on either side thereof. Once slice is shown as cross-hatched and has a distance $\Delta z$ from the station centerline 54 to the closest edge of the cross-hatched slice. (Alternatively, $\Delta z$ may be measured from the centerline 54 to the slice's own centerline or centroidal plane.) An axial image volume 76 comprises the set of slices 52 within the station 48.

Each station 46/48/50 may have an axial field of view (AFOV) length L, which may be the same for all stations, or it may vary from station to station depending upon the protocol chosen or other factors. For each slice 52, $R_{eff}$ may be equal to $\sqrt{(R_{in}^2-\beta^2\Delta z^2)}$, wherein $R_{in}$ is selected as a radius within which distortion of the MR data at the station isocenter 72 is acceptably low (i.e., a maximum acceptable inner radius) and $\beta$ is an adaptive weighting factor which may be a function of both L and $\Delta z$, such as $\beta=2\Delta z/L$. The station isocenter 72 for any given station may be defined as the point of intersection between the scanner axis 70 and the station's axial centerline 54. The maximum acceptable inner radius $R_{in}$ may be experimentally determined by determining the amount of distortion of the MR data (such as by utilizing a spatial distortion phantom 10, a calibration procedure, etc.) and comparing it against standards for resulting image quality which may be determined as acceptable (e.g., less than 5% transverse or axial spatial distortion). Referring to FIG. 9, the outer radius $R_{out}$ may remain fixed for all slices in a given station as illustrated by the straight trace 82, or it may be decreased as $\Delta z$ increases for selected slices within the station as illustrated by the curved trace 80. For slices further away from the axial centerline 54, $\Delta z$ increases and $R_{eff}$ decreases, as illustrated by the curved trace 78 in FIG. 9.

Figure 12:
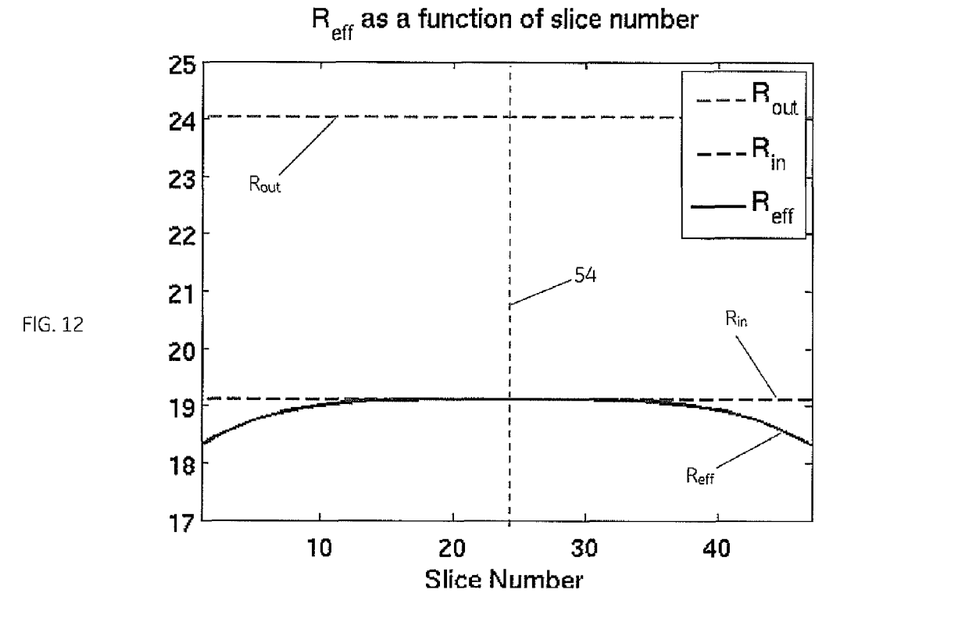
FIG. 12 is a plot of $R_{eff}$ as a function of slice number according to an embodiment of the present invention.
Figure 13:
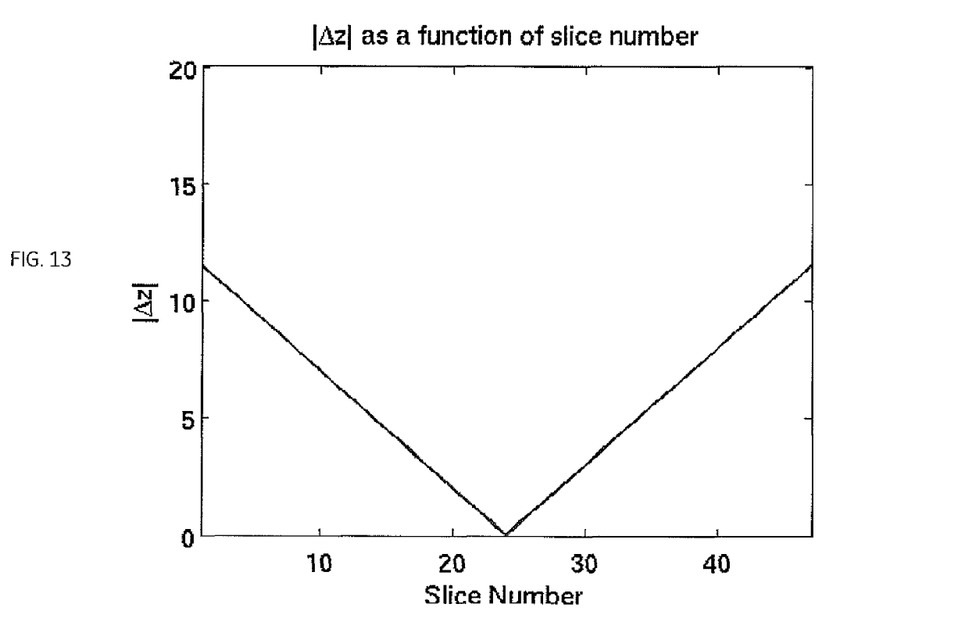
FIG. 13 is a plot of $|\Delta z|$ as a function of slice number according to an embodiment of the present invention.
Figure 14:
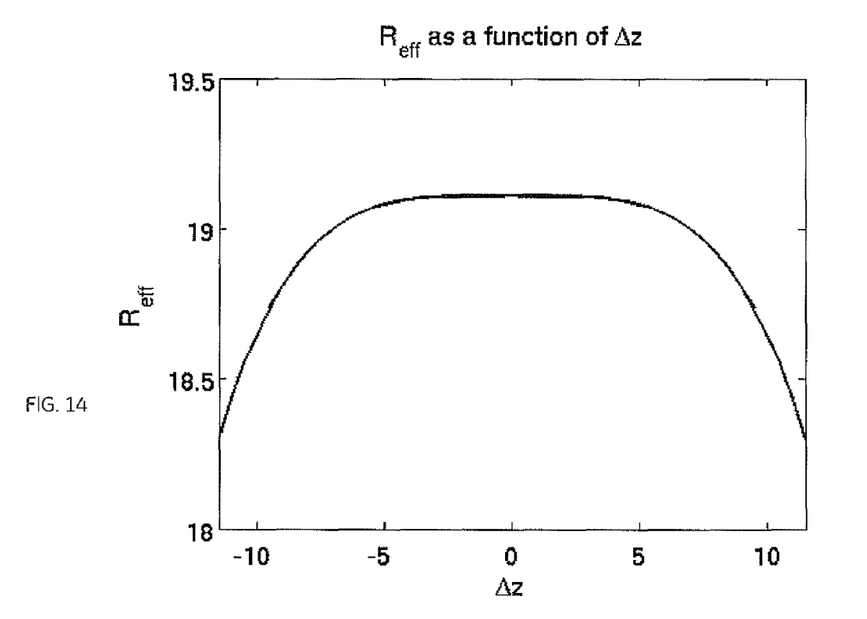
FIG. 14 is a plot of $R_{eff}$ as a function of $\Delta z$ according to an embodiment of the present invention.

FIGS. 12-14 illustrate various relationships among $R_{eff}$, $\Delta z$ and slice number according to various embodiments of the present invention. Here, slice numbers are assigned from 1 to 48 beginning at one end of the station, with slices 24 and 25 being immediately adjacent the axial centerline 54 (where $\Delta z=0$) and with slices 1 and 48 having maximum values for $\Delta z$. In FIG. 12, $R_{out}$ is shown as fixed, and $R_{eff}$ decreases the further away a slice is from the axial centerline 54. This curve of $R_{eff}$ corresponds to the curved trace 78 of $R_{eff}$ in FIG. 9. FIG. 13 shows that the absolute value of $\Delta z$ increases linearly as a slice is selected further away from the station centerline 54. FIG. 14 shows that $R_{eff}$ decreases (here according to $R_{eff}=\sqrt{(R_{in}^2-\beta^2\Delta z^2)}$) the further away a slice is from the station centerline 54.

The PET data referred to above may be non-attenuation corrected TOF data obtained from the PET scanner, and the MR data may be segmented into regions representing at least two of fat, water, lungs (air inside the patient) and background (air outside the patient). The PET and MR data from the region 68 of the annulus may comprise (i) the union of voxels determined to be tissue by either the PET data, the MR data or both, and/or (ii) a weighted combination of PET data and MR data based on the radius of each voxel between the inner radius $R_{eff}$ and the outer radius $R_{out}$.

Figure 15:
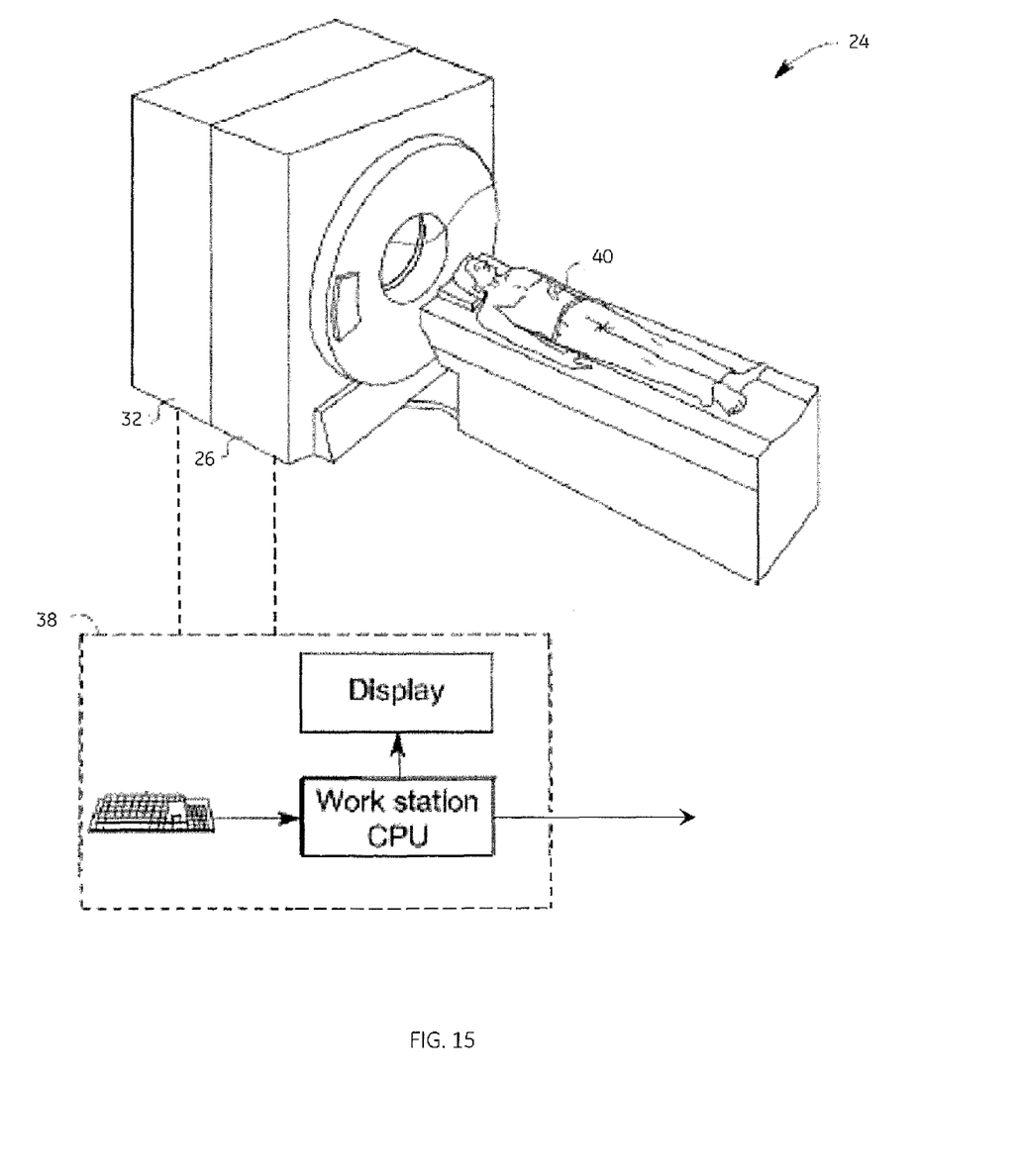
FIG. 15 shows a PET/MR system according to an embodiment of the present invention.

FIG. 15 shows an embodiment of the present invention in which there is provided a medical imaging system 24 through which a patient or other subject of interest 40 may be advanced in sequential stations 46/48/50. The system 24 comprises a PET imaging system 26, an MR imaging system 32 operably coupled with the PET imaging system, and a computer/control system 38 coupled to the PET system and the MR system. The computer 38 may comprise components such as a workstation/CPU (central processing unit), a display and one or more input devices (e.g., keyboards, etc.) and may be programmed to (a) define multiple transverse slices 52 within at least one of the stations 48 in which each slice is offset an axial distance $\Delta z$ from the station centerline 53; (b) define a center and an annulus 58 thereabout for each slice 52, wherein the annulus has an inner radius $R_{eff}$ and an outer radius $R_{out}$ extending from the center; and (c) conduct attenuation correction of image data from the PET system using MR data from the region 64 within the inner radius, PET data from the region 66 outside of the outer radius, and both PET and MR data from the region 68 of the annulus, in which $R_{eff}$ is decreased as $\Delta z$ is increased within the at least one station. The computer 38 may be further programmed to obtain an MR image dataset of the subject of interest from the MR imaging system 32 and a PET emission dataset of the subject of interest from the PET imaging system 26. The PET data may be NAC-TOF data, while the MR data may be segmented into regions representing at least two of fat, water, internal air/lungs and background/external air. Although not shown in FIG. 15, the computer/control system 38 may be connected to an external imaging device (perhaps utilizing a different but complementary imaging modality), external monitoring equipment (such as an electrocardiograph, respiration monitor, etc.) and/or other external system (such as a hospital or clinical PACS, HIS or RIS system).

TABLE 1 shows an example of two slices within a given station having different values of the distance $\Delta z$ from the station centerline 54. This difference in $\Delta z$ creates different $\beta$ values for the two slices, and results in different $R_{eff}$ values for the two slices as well. Note that the distance $\Delta z$ for the slice in Example 2 is relatively small (only 2 cm), resulting in a relatively small $\beta$ value and an effective inner radius $R_{eff}$ of 19.5 cm which is only negligibly diminished from the maximum inner radius $R_{in}$ of 19.6 cm (which was experimentally determined for this particular PET/MR system). However, the distance $\Delta z$ for the slice in Example 1 is relatively larger (10 cm), resulting in a larger $\beta$ value and an effective inner radius $R_{eff}$ of 18.5 cm which is more substantially diminished from the maximum inner radius $R_{in}$ of 19.6 cm than was the slice for Example 2. The $\beta$ values continue to increase and the $R_{eff}$ values continue to decrease as slices further away from the station axial centerline 54 (i.e., increasing $\Delta z$) are considered. Thus, according to various embodiments of the present invention, as $\Delta z$ increases, more reliance is placed on the PET image data for truncation completion/attenuation correction than is for the MR image data.

TABLE 1

|  | Example 1 | Example 2 |
| --- | --- | --- |
| PET DFOV | 60 cm | 60 cm |
| MR DVOV | 50 cm | 50 cm |
| PET AFOV | 25 cm | 25 cm |
| $\Delta s$ | 2.8 cm | 2.8 cm |
| $R_{out}$ | 25 cm | 25 cm |
| $R_{in}$ | 19.6 cm | 19.6 cm |
| $\Delta z$ | 10 cm | 2 cm |

TABLE 1-continued

|  | Example 1 | Example 2 |
|---|---|---|
| β | 0.8 | 0.08 |
| $R_{eff}$ | 18.5 cm | 19.5 cm |

The various embodiments of the present invention may be utilized for truncation completion of the MR images, the MR data and/or the initial MR/pseudo-CT mask, and/or for MR-based attenuation correction of PET images in a PET/MR system. Also, though only three stations 46/48/50 are shown in the figures for the sake of illustration, those skilled in the art will recognize that additional stations may be utilized, such as in whole-body scanning, and may utilize stations that are contiguous, non-contiguous and/or overlapping, depending on the protocol selected or other factors. Additionally, while the method of the present invention was described above in one embodiment 100 and in FIG. 10 as proceeding from step 110 to 120 to 130, the present invention is not limited to only this order. For example, the step 130 of varying $R_{eff}$ as a function of $\Delta z$ may be performed before or during the step 120 of truncation completion and/or MRAC, including iteratively and/or alternatingly.

The above description is intended to be illustrative, and not restrictive. While the invention has been described in terms of various specific embodiments, those skilled in the art will recognize that the invention can be practiced with modification within the spirit and scope of the claims. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to illustrate the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the invention, including the best mode, and also to enable those skilled in the art to practice the invention, including making and using any devices or systems thereof and performing any methods thereof. It is the following claims, including all equivalents, which define the scope of the present invention.

The invention claimed is:

1. A method for attenuation correction in a PET/MR system having a PET scanner with a first diameter field of view $DFOV_{PET}$ and an MR scanner with a second diameter field of view $DFOV_{MR}$, in which a patient may be advanced through the system in sequential stations, with multiple transverse slices defined within at least one of the stations in which each slice is offset an axial distance $\Delta z$ from the station axial centerline, comprising the steps of:

(a) defining a center and an annulus thereabout for each slice, wherein the annulus has an inner radius $R_{eff}$ and an outer radius $R_{out}$ extending from the center;
(b) conducting attenuation correction of image data from the PET scanner using MR data from the region within the inner radius, PET data from the region outside of the outer radius, and both PET and MR data from the region of the annulus; and
(c) varying $R_{eff}$ as a function of $\Delta z$ for selected slices within the at least one station.

2. A method according to claim 1, wherein the center of each slice coincides with the centroid thereof or with the intersection of the scanner axis and the station centerline.

3. A method according to claim 1, wherein $R_{out} \approx DFOV_{MR}/2$.

4. A method according to claim 1, wherein $R_{eff}$ is decreased as $\Delta z$ increases.

5. A method according to claim 1, wherein the at least one station has an axial field of view length L and $R_{eff} \approx \sqrt{R_{in}^2 - \beta^2 \Delta z^2}$, wherein $R_{in}$ is selected as a radius within which distortion of the MR data at the station isocenter is acceptably low and β is an adaptive weighting factor which is a function of both L and $\Delta z$.

6. A method according to claim 5, wherein $\beta = 2\Delta z/L$.

7. A method according to claim 1, wherein $R_{out}$ is decreased as $\Delta z$ increases for selected slices within the station.

8. A method according to claim 1, wherein the PET data is non-attenuation corrected time-of-flight data obtained from the PET scanner.

9. A method according to claim 1, wherein the MR data is segmented into regions representing at least two of fat, water, air inside the patient and air outside the patient.

10. A method according to claim 1, wherein the PET and MR data from the region of the annulus comprises (i) the union of voxels determined as tissue by either the PET data, the MR data or both, and/or (ii) a weighted combination of PET data and MR data based on the radius of each voxel between $R_{eff}$ and $R_{out}$.

11. A method for truncation completion of an MR-derived attenuation image in a PET/MR system having a PET scanner with a first diameter field of view $DFOV_{PET}$ and an MR scanner with a second diameter field of view $DFOV_{MR}$, in which a patient may be advanced through the system in sequential stations, with multiple transverse slices defined within at least one of the stations in which each slice is offset an axial distance $\Delta z$ from the station centerline, comprising the steps of:

(a) defining a center and an annulus thereabout for each slice, wherein the annulus has an inner radius $R_{eff}$ and an outer radius $R_{out}$ extending from the center;
(b) conducting attenuation correction of the PET scanner image data using segmented MR data from the region within the inner radius, non-attenuation corrected PET data from the region outside of the outer radius, and both non-attenuation corrected PET data and segmented MR data from the region of the annulus; and
(c) decreasing $R_{eff}$ as a function of increasing $\Delta z$ within the at least one station.

12. A method according to claim 11, wherein the center of each slice coincides with the centroid thereof or with the intersection of the scanner axis and the station centerline.

13. A method according to claim 11, wherein $R_{out} \approx DFOV_{MR}/2$.

14. A method according to claim 11, wherein the at least one station has an axial field of view length L and $R_{eff} =$ $\sqrt{R_{in}^2-\beta^2\Delta z^2}$, wherein $R_{in}$ is selected as a radius within which distortion of the MR data at the station isocenter is acceptably low and $\beta=2\Delta z/L$.

15. A method according to claim 11, wherein $R_{out}$ is decreased as $\Delta z$ increases for selected slices within the station.

16. A method according to claim 11, wherein the non-attenuation corrected PET data is time-of-flight data and the segmented MR data is segmented into regions representing at least two of fat, water, air inside the patient and air outside the patient.

17. A method according to claim 11, wherein the PET and MR data from the region of the annulus comprises (i) the union of voxels determined as tissue by either the PET data, the MR data or both, and/or (ii) a weighted combination of PET data and MR data based on the radius of each voxel between $R_{eff}$ and $R_{out}$.

18. A medical imaging system through which a subject of interest may be advanced in sequential stations, comprising:
 a Positron Emission Tomography (PET) imaging system,
 a Magnetic Resonance (MR) imaging system operably coupled with said PET imaging system, and
 a computer coupled to the PET system and the MR system, said computer being programmed to:
  define multiple transverse slices within at least one of the stations in which each slice is offset an axial distance $\Delta z$ from the station centerline;
  define a center and an annulus thereabout for each slice, wherein the annulus has an inner radius $R_{eff}$ and an outer radius $R_{out}$ extending from the center; and
  conduct attenuation correction of image data from the PET system using MR data from the region within the inner radius, PET data from the region outside of the outer radius, and both PET and MR data from the region of the annulus, in which $R_{eff}$ is decreased as $\Delta z$ is increased for selected slices within the at least one station.

19. A medical imaging system according to claim 18, wherein the computer is further programmed to obtain an MR image dataset and a PET emission dataset of the subject of interest.

20. A medical imaging system according to claim 18, wherein the PET data is non-attenuation corrected time-of-flight data and the MR data is segmented into regions representing at least two of fat, water, air inside the patient and air outside the patient.

* * * * *